US011735606B2

(12) United States Patent
Feng et al.

(10) Patent No.: US 11,735,606 B2
(45) Date of Patent: Aug. 22, 2023

(54) DISPLAY PANEL AND DISPLAY DEVICE WITH DIFFERENT DISPLAY REGIONS

(71) Applicant: BOE Technology Group Co., Ltd., Beijing (CN)

(72) Inventors: Yu Feng, Beijing (CN); Libin Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 506 days.

(21) Appl. No.: 16/834,492

(22) Filed: Mar. 30, 2020

(65) Prior Publication Data
US 2021/0151483 A1 May 20, 2021

(30) Foreign Application Priority Data
Nov. 18, 2019 (CN) .......................... 201911130156.0

(51) Int. Cl.
*H01L 27/146* (2006.01)
*G06F 1/16* (2006.01)

(52) U.S. Cl.
CPC ...... *H01L 27/14605* (2013.01); *G06F 1/1605* (2013.01); *H01L 27/14649* (2013.01)

(58) Field of Classification Search
None
See application file for complete search history.

(56) References Cited

U.S. PATENT DOCUMENTS

| 2017/0193966 | A1 | 7/2017 | Tsuei et al. |
| 2018/0219058 | A1 | 8/2018 | Xiang et al. |
| 2020/0176539 | A1* | 6/2020 | Sung .................... G09G 3/3233 |
| 2020/0227488 | A1 | 7/2020 | Xin et al. |

FOREIGN PATENT DOCUMENTS

| CN | 105304559 A | 2/2016 |
| CN | 108010947 A | 5/2018 |
| CN | 108922900 A | 11/2018 |
| CN | 208507679 A | 2/2019 |
| CN | 109755282 A | 5/2019 |

OTHER PUBLICATIONS

Huang et al., The Invention Claims A Display Device and Display Method Thereof; 2018, CN. (Year: 2018).*
Office Action corresponding Chinese Patent Application No. 201911130156.0 dated Oct. 10, 2022.

* cited by examiner

*Primary Examiner* — Nilufa Rahim
(74) *Attorney, Agent, or Firm* — ArentFox Schiff LLP; Michael Fainberg

(57) ABSTRACT

Disclosed are a display panel and a display device. The display panel includes a base substrate, and a first display region and a second display region that are located on the base substrate, where the first display region includes a plurality of first sub-pixels and a plurality of transparent regions, the second display region includes a plurality of second sub-pixels, and a distribution density of the first sub-pixels is smaller that of the second sub-pixels; and an area occupied by the first sub-pixels is smaller than that occupied by the second sub-pixels.

9 Claims, 8 Drawing Sheets

DISPLAY PANEL AND DISPLAY DEVICE WITH DIFFERENT DISPLAY REGIONS

The present application claims the priority from Chinese Patent Application No. 201911130156.0, filed with the Chinese Patent Office on Nov. 18, 2019, and entitled "DISPLAY PANEL AND DISPLAY DEVICE", which is hereby incorporated by reference in its entirety.

FIELD

The present disclosure relates to the field of display technologies, and in particular to a display panel and a display device.

BACKGROUND

With the continuous development of display technologies, people's requirements on a display device are getting higher and higher. They have not only required the display device to have basic display functions, but also required the display device to have certain imaging and recognition functions, such as photographing functions and face recognition and unlocking functions, which requires the integration of a camera and an infrared face recognition structure in a display panel.

In a display device of the related art, the camera and the infrared face recognition structure are set in a non-display region, but such a setting occupies a large part of the non-display region, resulting in a decrease in the screen-to-body ratio of the display region, which is not conducive to the realization of full screen display.

SUMMARY

In one aspect, the embodiments of the present disclosure provide a display panel including: a base substrate, and a first display region and a second display region that are arranged on the base substrate;

wherein the first display region includes a plurality of first sub-pixels and a plurality of transparent regions, the second display region includes a plurality of second sub-pixels, and a distribution density of the first sub-pixels is smaller than that of the second sub-pixels; and an area occupied by the first sub-pixels is smaller than that occupied by the second sub-pixels.

In a possible implementation, in the display panel provided by the embodiments of the present disclosure, first sub-pixels arranged in a same row are electrically connected with a same first initial signal line extending in a first direction; first sub-pixels arranged in different rows are electrically connected with different first initial signal lines extending in the first direction, respectively; and second sub-pixels in every two adjacent rows are electrically connected with a same second initial signal line extending in the first direction.

In a possible implementation, the display panel provided by the embodiments of the present disclosure further includes: trace regions arranged between every two adjacent first sub-pixels in the first direction;

where, the every two adjacent first sub-pixels in the first direction are electrically connected with a same third initial signal line extending in a second direction in the trace regions; and the first direction and the second direction are perpendicular to each other.

In a possible implementation, in the display panel provided by the embodiments of the present disclosure, each of the first sub-pixels at least includes a semiconductor layer, a gate layer, a source-drain electrode layer and a shielding electrode; and an orthographic projection of the shielding electrode on the base substrate at least covers an orthographic projection of the semiconductor layer on the base substrate.

In a possible implementation, in the display panel provided by the embodiments of the present disclosure, the third initial signal line is arranged at a same layer as a source-drain electrode layer, and the third initial signal line is arranged at different layers from the first initial signal line and the second initial signal line.

In a possible implementation, in the display panel provided by the embodiments of the present disclosure, the shielding electrode is electrically connected with the corresponding source-drain electrode layer.

In a possible implementation, the display panel provided by the embodiments of the present disclosure further includes: a first voltage signal line, a second voltage signal line and a third voltage signal line that are arranged on the base substrate;

the first voltage signal line and the second voltage signal line are configured to provide a positive voltage signal, respectively, and the third voltage signal line is configured to provide a negative voltage signal; and the first voltage signal line is electrically connected with the first sub-pixels, the second voltage signal line is electrically connected with the second sub-pixels, and the third voltage signal line is electrically connected with the first sub-pixels and the second sub-pixels, respectively.

In a possible implementation, in the display panel provided by the embodiments of the present disclosure, a voltage applied to the first voltage signal line is greater than an voltage applied to the second voltage signal line.

In a possible implementation, the display panel provided by the embodiments of the present disclosure further includes: an infrared sensor and an infrared receiver that are arranged in the first display region;

the infrared sensor and the infrared receiver are arranged between the base substrate and the first sub-pixels; and an orthographic projection of the infrared sensor on the base substrate and an orthographic projection of the infrared receiver on the base substrate have an overlapping area with an orthographic projection of the plurality of first sub-pixels on the base substrate, respectively.

In another aspect, the embodiments of the present disclosure also provide a display device including the display panel provided by any one of the aforementioned embodiments.

In a possible implementation, the display device provided by the embodiments of the present disclosure further includes: a groove arranged in the display panel, and a camera arranged in the groove.

DETAILED DESCRIPTION OF THE EMBODIMENTS

Figure 1:
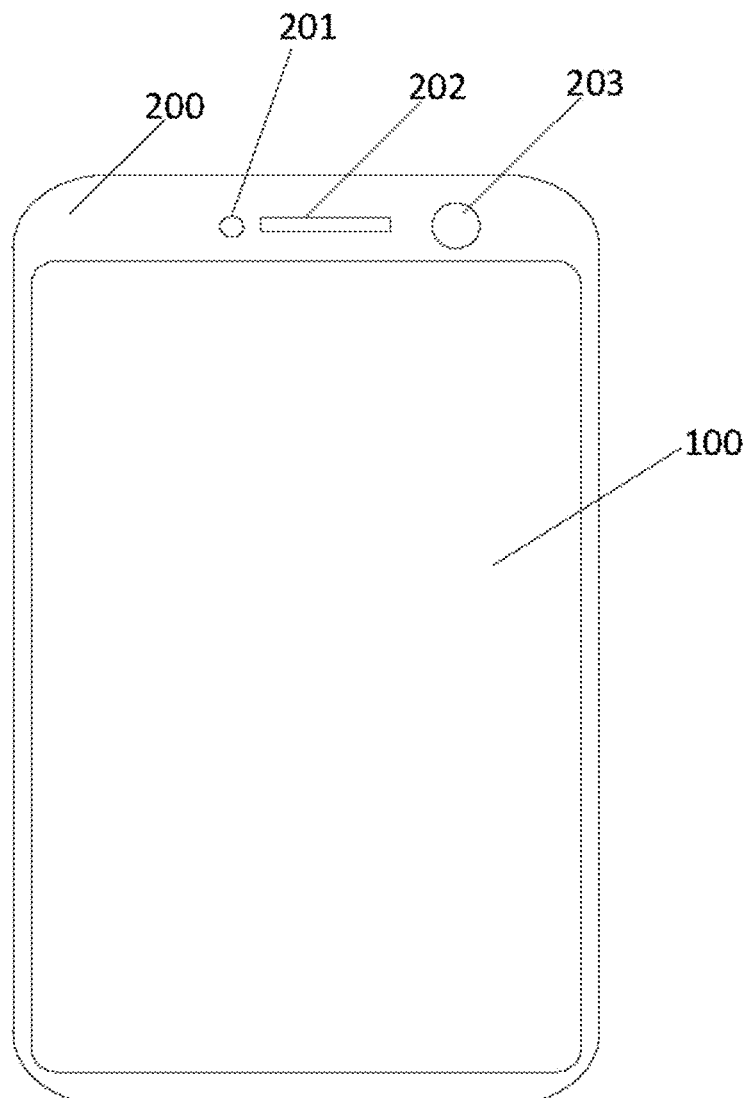
FIG. 1 is a schematic diagram of the plane structure of a display device in the related art.

As shown in FIG. 1, a display device of the related art includes a display region 100 and a peripheral region 200 surrounding the display region 100. Some functional devices of the display device are disposed in the peripheral region 200, such as a camera 201, an infrared imaging structure 203, an earphone 202, etc.

The infrared imaging structure 203 is set as an example of replacing a traditional fingerprint identification and unlocking structure, and recognizes a human face through infrared imaging, thereby achieving the purpose of unlocking the display device. However, setting functional components such as the infrared imaging structure 203 in the peripheral region 200 reduces the screen-to-body ratio of the display region 100, which is not conducive to realization of full screen display. Therefore, it is an urgent technical problem to be solved by those skilled in the art how to make the display device have the imaging function without reducing the screen-to-body ratio of the display region.

Based on the aforementioned problems existing in the related art, the embodiments of the present disclosure provide a display panel and a display device. In order to make the objectives, technical solutions and advantages of the present disclosure clearer, the implementation of the display panel and display device provided by the embodiments of the present disclosure will be described in detail below in conjunction with the accompanying drawings. It should be understood that, the preferred embodiments described hereafter are only intended to illustrate and explain the present disclosure, rather than limiting the present disclosure. Also, the embodiments in this application and the features in various embodiments may be combined with each other without conflict.

Unless otherwise defined, technical or scientific terms used in the present disclosure shall have the general meanings understood by those of ordinary skills in the art to which the present disclosure pertains. The words "first", "second" and the like used in the present disclosure do not denote any order, quantity or importance, but are only used to distinguish different constituent parts. "including" or "include" and the like similar words mean that the elements or articles appearing before the word encompass the elements or articles listed after the word and their equivalents, and do not exclude other elements or articles. "connection" or "connected" and the like similar words are not limited to physical or mechanical connections, but may include electrical connection, whether direct or indirect. "upper", "lower", "left", "right" and the like are only used for indicating a relative positional relationship. When the absolute position of a described object changes, the relative positional relationship may also change accordingly.

The shapes and sizes of the components in the drawings do not reflect the true proportions, and the purpose is only to schematically illustrate the disclosure of the present disclosure.

Figure 2:
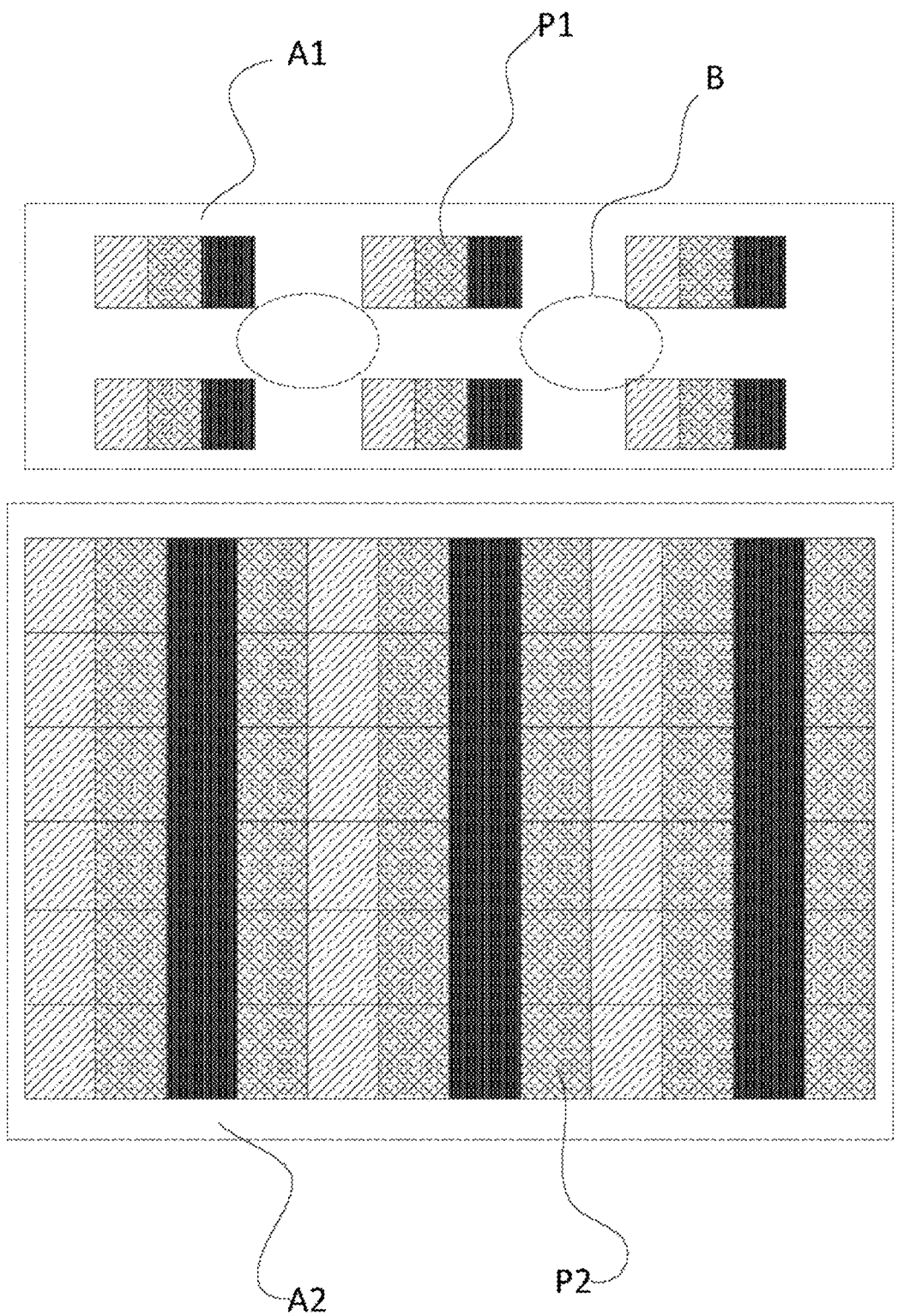
FIG. 2 is a first schematic structural diagram of a display panel provided by embodiments of the present disclosure.

Particularly, the embodiments of the present disclosure provide a display panel, as shown in FIG. 2, which includes a base substrate, and a first display region A1 and a second display region A2 that are located on the base substrate;

the first display region A1 includes a plurality of first sub-pixels P1 and a plurality of transparent regions B, the second display region A2 includes a plurality of second sub-pixels P2, and a distribution density of the first sub-pixels P1 is smaller than a distribution density of the second sub-pixels P2; and an area occupied by the first sub-pixels P1 is smaller than an area occupied by the second sub-pixels P2.

Particularly, in the display panel provided by the embodiments of the present disclosure, by setting the first display region and the second display region with different distribution densities of sub-pixels in the display region, the distribution density of the first sub-pixels in the first display region is smaller than the distribution density of the second sub-pixels, so that larger gap regions exist between adjacent first sub-pixels in the first display region, that is, transparent regions located between the adjacent first sub-pixels are formed, and by making the area occupied by the first sub-pixels be smaller than the area occupied by the second sub-pixels in the second display region, the area of the transparent regions is further increased. Therefore, some imaging structures can be arranged between the base substrate and the first sub-pixels, and the imaging structures can conduct imaging through transparent regions, which not only can meet the requirement of the imaging function of the display device, but also can cause no reduction of the area of the display region, and thus it is conducive to realization of full screen display.

It should be noted that, in the display panel provided by the embodiments of the present disclosure, particularly, the pixel circuits in each of the first sub-pixels can be compactly arranged by reducing the pixel circuits in each of the first sub-pixels and the line width of related signal lines and reducing the line spacing between adjacent lines. The area occupied by each of the first sub-pixels can be reduced by comparing compact pixel circuits in the first sub-pixels with tiled pixel circuits in the second sub-pixels in the second display region.

Optionally, in the display panel provided by the embodiments of the present disclosure, the first display region may be located in an region where the top or bottom end of the second display region is located, or may also be located in the second display region so that the second display region surrounds the first display region. Also, the width of the first display region in a first direction may be smaller than the width of the second display region in the first direction, and the first display region and the second display region are arranged in a second direction. The first direction may be the extending direction of a gate line, and the second direction may be the extending direction of a data line.

Figure 3:
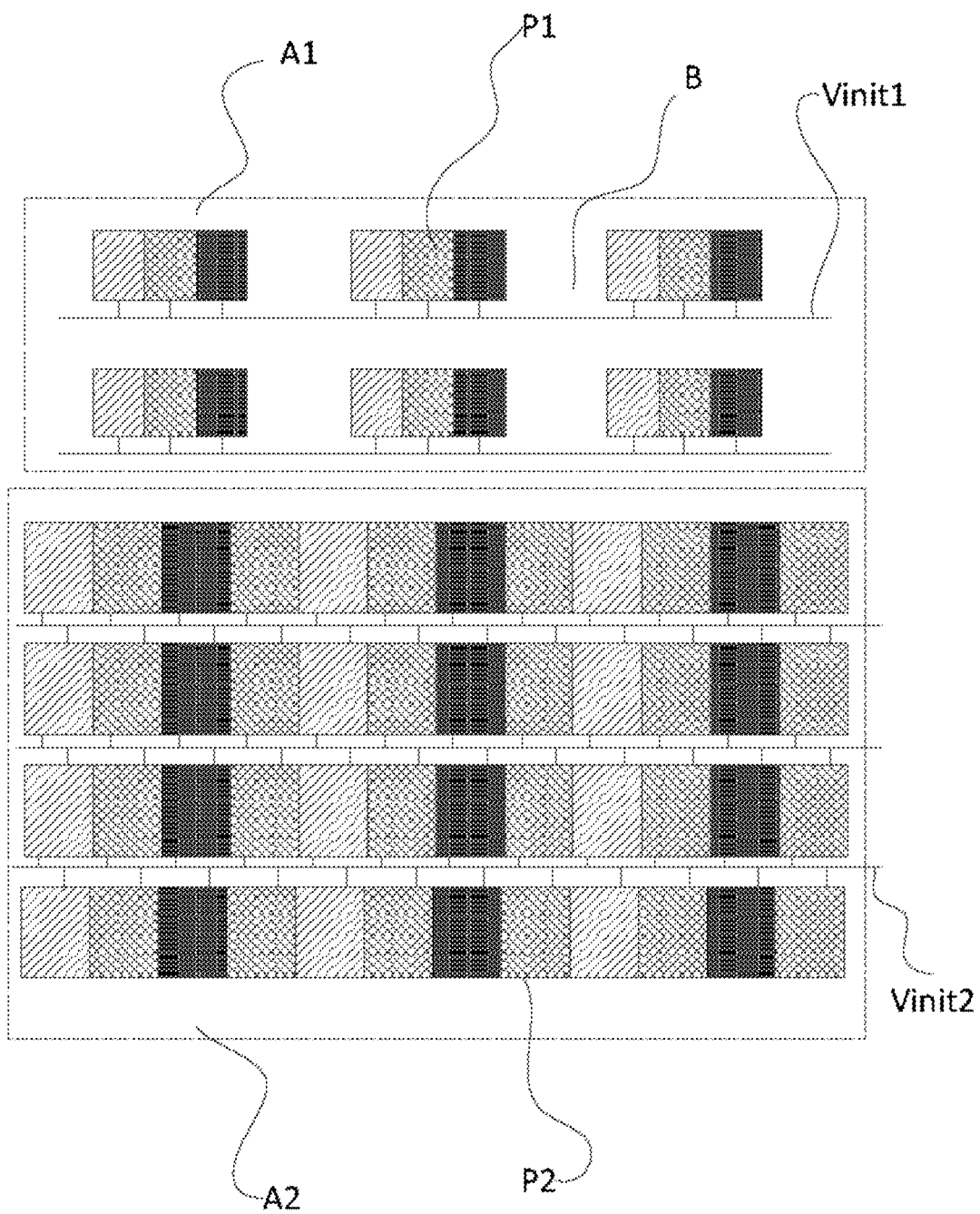
FIG. 3 is one of schematic diagrams of trace structures in a first display region of the display panel provided by embodiments of the present disclosure.
Figure 4A:
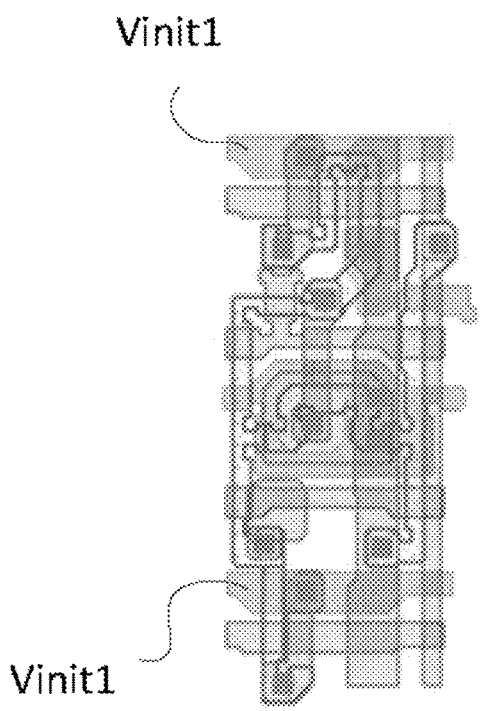
FIG. 4a is a first schematic diagram of local circuit structures in the first display region of FIG. 3 provided by embodiments of the present disclosure.
Figure 4B:
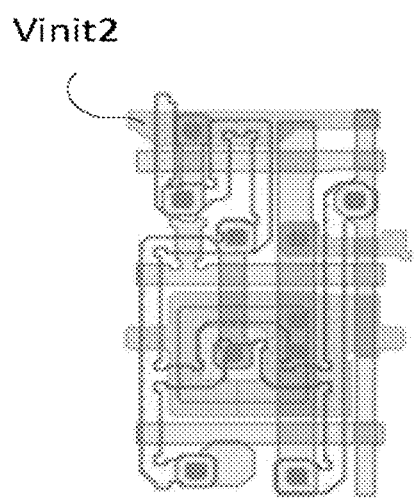
FIG. 4b is a schematic diagram of local circuit structures in the first display region of FIG. 3 provided by embodiments of the present disclosure.

Optionally, in the display panel provided by the embodiments of the present disclosure, as shown in FIG. 3, FIG. 4a and FIG. 4b, the first sub-pixels P1 arranged in a same row are electrically connected with a same first initial signal line Vinit1 extending in the first direction; the first sub-pixels P1 located in different rows are electrically connected with different first initial signal lines Vinit1 extending in the first direction, respectively; and the second sub-pixels P2 in every two adjacent rows are electrically connected with a same second initial signal line Vinit2 extending in the first direction.

Particularly, in the display panel provided by the embodiments of the present disclosure, the first sub-pixels located in the same row are electrically connected with a first initial signal line, and each row of first sub-pixels is provided with a first initial signal line corresponding thereto. Compared with the same second initial signal line shared by the second sub-pixels in two adjacent rows in the second display region, the first initial signal line may be arranged close to the first sub-pixels with small spacings between the lines, thereby further increasing the area of the transparent regions.

Figure 5A:
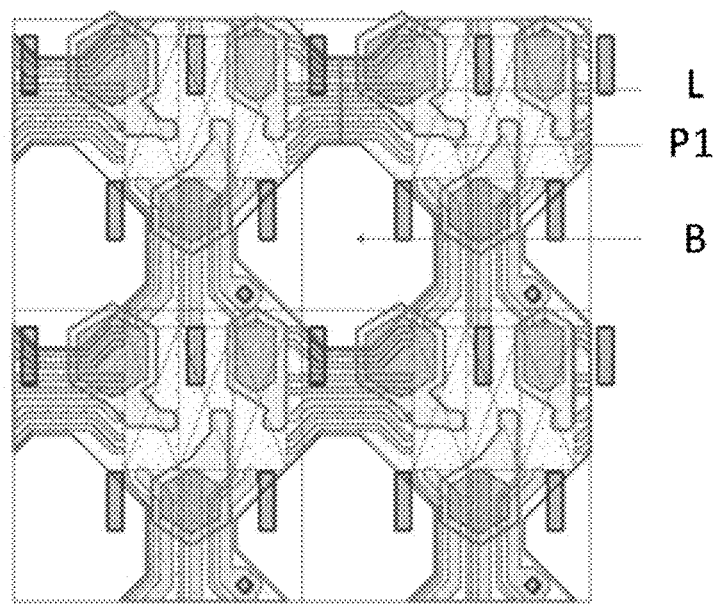
FIG. 5a is a second schematic diagram of local circuit structures in the first display region of FIG. 3 provided by embodiments of the present disclosure.
Figure 5B:
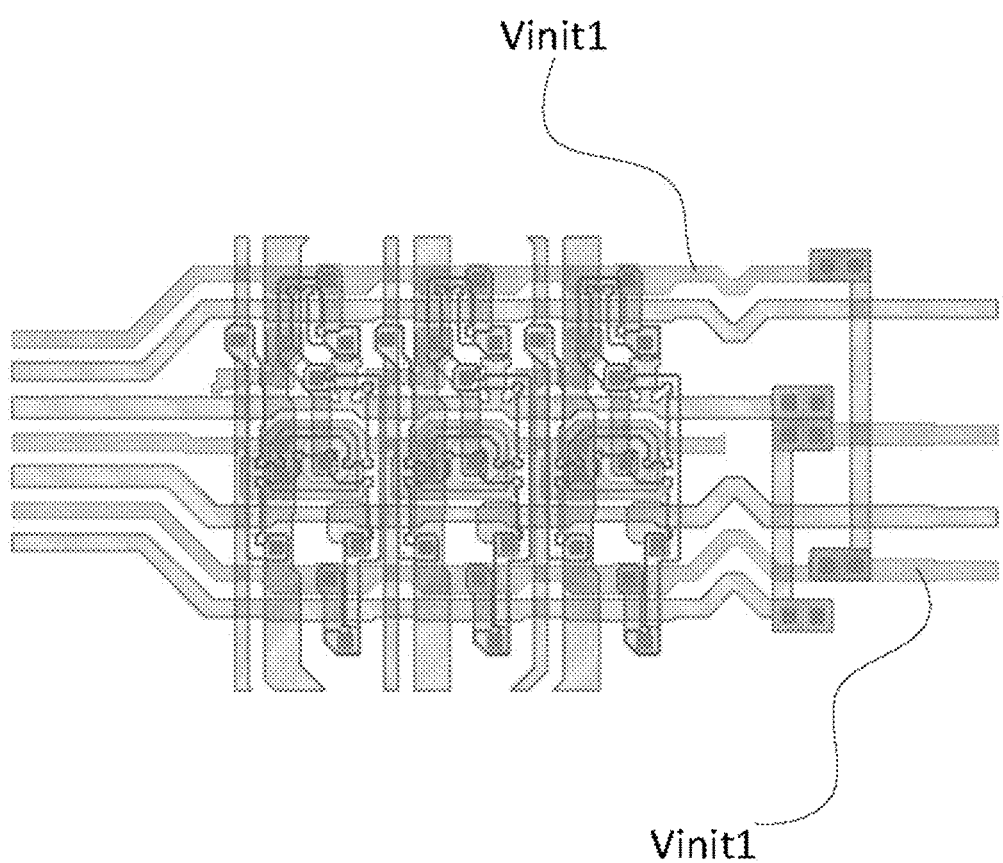
FIG. 5b is a third schematic diagram of local circuit structures in the first display region of FIG. 3 provided by embodiments of the present disclosure.

Optionally, in the display panel provided by the embodiments of the present disclosure, as shown in FIG. 5a and FIG. 5b, the display panel further includes: trace regions L located between every two adjacent first sub-pixels P1 in the first direction;

where, the every two adjacent first sub-pixels P1 in the first direction share a same third initial signal line Vinit3 extending in the second direction in the trace regions L; and the first direction and the second direction are perpendicular to each other.

Particularly, in the display panel provided by the embodiments of the present disclosure, the display panel further includes trace regions L located between adjacent first sub-pixels, and traces in each of the trace regions are set in a compact manner with small spacings therebetween, thereby increasing the area of the transparent regions. Also, the traces to which the same signal is applied may be connected into one trace in each trace region, such as the third initial signal line. At positions corresponding to the first sub-pixels, each row of first sub-pixels is provided with a first initial signal line. However, in each of the trace regions, the traces in the each of the trace regions, such as the first initial signal lines, may be electrically connected with one third initial signal line. That is, there is only one third initial signal line in each of trace regions. Such a setting not only ensures the effective transmission of signals, but also reduces the area occupied by the trace regions.

Figure 6:
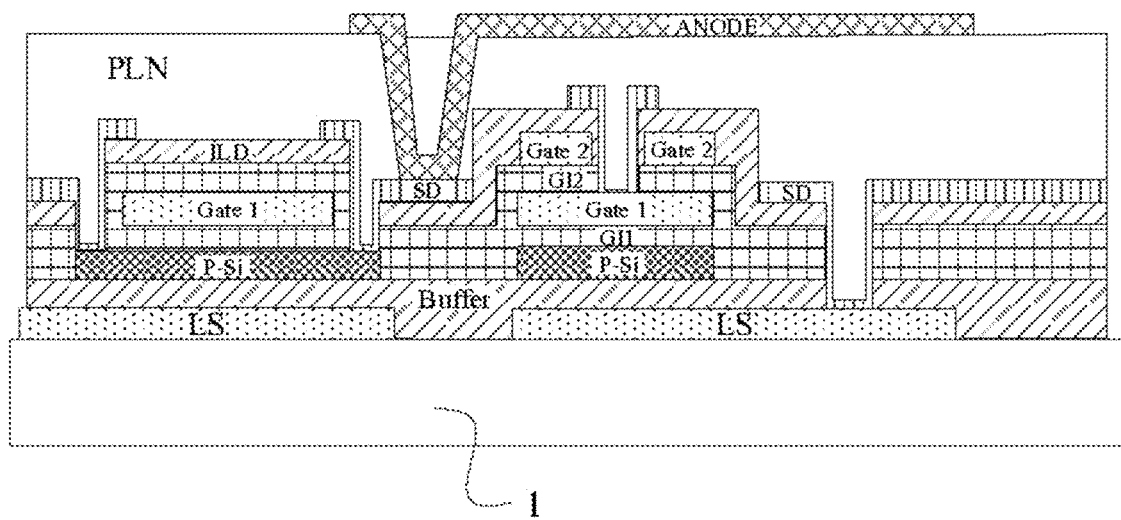
FIG. 6 is a schematic diagram of cross-sectional structure of a first sub-pixel provided by embodiments of the present disclosure.

Optionally, in the display panel provided by the embodiments of the present disclosure, as shown in FIG. 6, the first sub-pixel at least includes a semiconductor layer P—Si, a gate layer Gate1, a source-drain electrode layer SD and a shielding electrode LS; and an orthographic projection of the shielding electrode LS on the base substrate 1 at least covers an orthographic projection of the semiconductor layer P—Si on the base substrate 1.

Optionally, in the display panel provided by the embodiments of the present disclosure, the third initial signal line Vinit3 is arranged at a same layer as a source-drain electrode layer SD, and the third initial signal line Vinit3 is arranged at different layers from the first initial signal line Vinit1 and the second initial signal line Vinit2.

Particularly, in the display panel provided by the embodiments of the present disclosure, the display panel includes a buffer layer, a semiconductor layer, a first gate insulating layer, a gate layer, a second gate insulating layer, a gate trace layer, an interlayer dielectric layer, a source-drain electrode layer, a planarization layer and a pixel electrode layer which are sequentially located on the base substrate. In the first display region, an infrared imaging structure may be disposed between a first sub-pixel region and the base substrate, and the infrared light emitted by the infrared imaging structure may affect the semiconductor layer. Therefore, in order to avoid the influence on the semiconductor layer, a shielding electrode layer may be disposed between the base substrate and the buffer layer, and the orthographic projection of the shielding electrode layer on the base substrate at least covers the orthographic projection of the semiconductor layer on the base substrate, so as to protect the semiconductor layer, and the shielding electrode is not included in a region other than the first sub-pixels region, so as to avoid reduction of the area of the transparent regions.

Optionally, in the display panel provided by the embodiments of the present disclosure, as shown in FIG. 6, the shielding electrode LS is electrically connected with the source-drain electrode layer SD.

Particularly, in the display panel provided by the embodiments of the present disclosure, the shielding electrode may be electrically connected with the source-drain electrode layer, so that a corresponding thin film transistor forms a double gate structure to reduce leakage current of the thin film transistor and thus improve the pixel driving performance.

It should be noted that, in the display panel provided by the embodiments of the present disclosure, in order to ensure the consistency of the manufacturing process, shielding electrodes may also be arranged at the positions corresponding to the second sub-pixels in the second display region, and of course, shielding electrodes may not be arranged in the second display region. Selection may be made according to actual needs, which is not specifically limited here.

Optionally, the display panel provided by the embodiments of the present disclosure further includes a first voltage signal line, a second voltage signal line and a third voltage signal line which are located on the base substrate;

the first voltage signal line and the second voltage signal line are configured to provide a positive voltage signal, respectively, and the third voltage signal line is configured to provide a negative voltage signal; and the first voltage signal line is electrically connected with the first sub-pixels, the second voltage signal line is electrically connected with the second sub-pixels, and the third voltage signal line is electrically connected with the first sub-pixels and the second sub-pixels, respectively.

Particularly, in the display panel provided by the embodiments of the present disclosure, since the distribution density of the first sub-pixels in the first display region is smaller than the distribution density of the second sub-pixels in the second display region, that is, the number of sub-pixels set in the first display region is smaller than the number of sub-pixels set in the second display region. The brightness of the first display region will be smaller than the brightness of the second display region when the same gray scale is input, resulting in uneven overall display brightness of the display panel. In order to reduce the brightness difference between the first display region and the second display region, two voltage signal lines, namely the first voltage signal line and the second voltage signal line, are arranged in a non-display region, where the first voltage signal line is electrically connected with the first sub-pixels, and the second voltage signal line is electrically connected with the second sub-pixels, and voltages with different intensities can be applied to the first voltage signal line and the second voltage signal line to adjust the brightness difference between the first display region and the second display region.

Optionally, in the display panel provided by the embodiments of the present disclosure, the voltage applied to the first voltage signal line is greater than the voltage applied to the second voltage signal line.

Particularly, in the display panel provided by the embodiments of the present disclosure, the voltage applied to the first voltage signal line may be increased, so that the voltage applied to the first voltage signal line is greater than the voltage applied to the second voltage signal line, and thus the brightness of the light emitting device connected with the pixel circuit corresponding to the first voltage signal line is greater than the brightness of the light emitting device connected with the pixel circuit corresponding to the second voltage signal line, thereby compensating for the brightness difference caused by the distribution density difference of the first sub-pixels and the second sub-pixels.

It should be noted that, in the display panel provided by the embodiments of the present disclosure, when there is no obvious requirement on the brightness in the first display region, for example when the first display region conducts display of a fixed image and only the second display region refreshes, the same voltage signal may be applied to the first voltage signal line and the second voltage signal line, and the selection may be made specifically according to the actual use situation, which is not specifically limited here.

Figure 7:
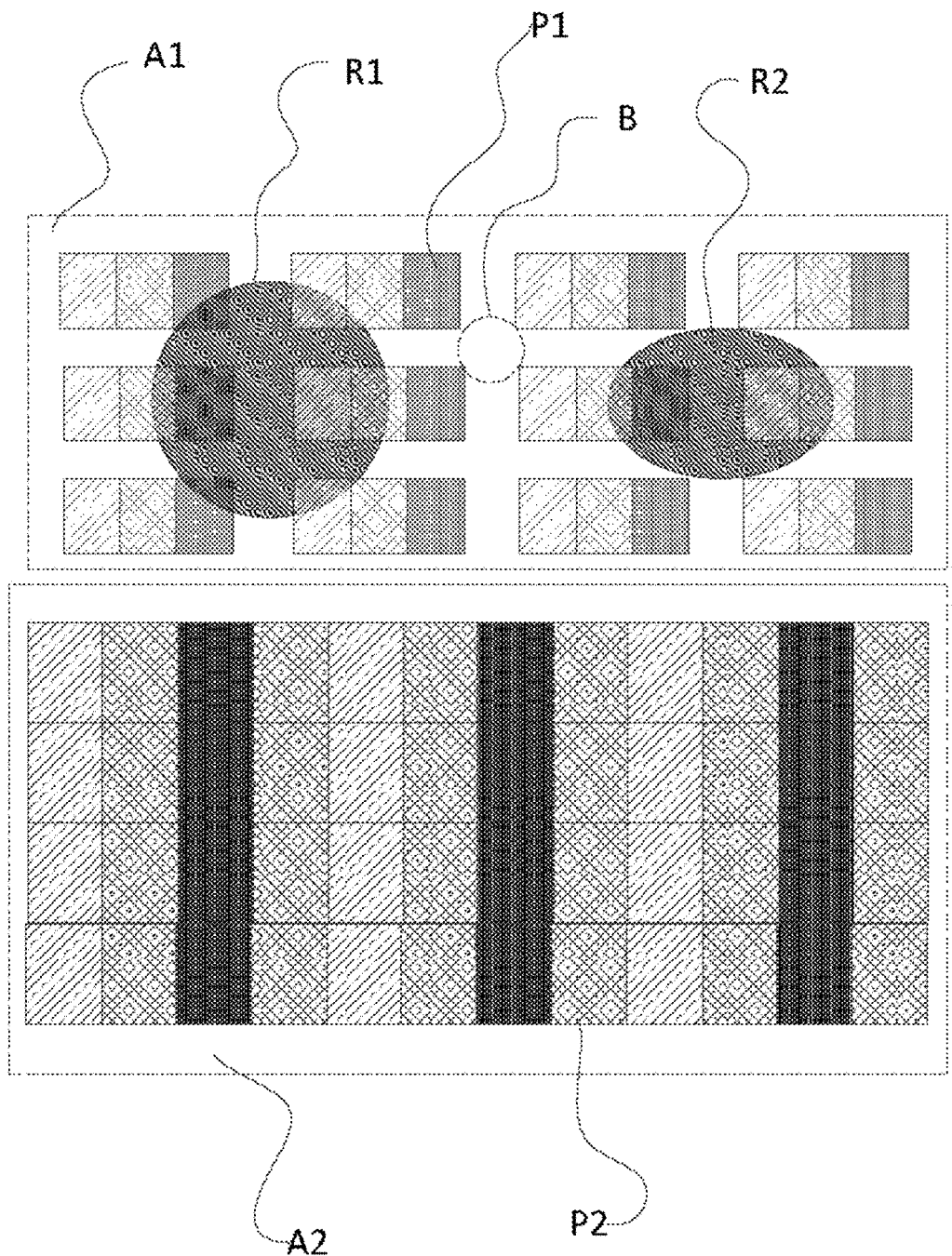
FIG. 7 is a second schematic structural diagram of the display panel provided by embodiments of the present disclosure.

Optionally, in the display panel provided by the embodiments of the present disclosure, as shown in FIG. 7, the display panel further includes an infrared sensor R1 and an infrared receiver R2 located in the first display region A1;

the infrared sensor R1 and the infrared receiver R2 are located between the base substrate and the first sub-pixels P1; and an orthographic projection of the infrared sensor R1 on the base substrate and an orthographic projection of the infrared receiver R2 on the base substrate have an overlapping area with an orthographic projection of the plurality of first sub-pixels P1 on the base substrate, respectively. Optionally, the infrared sensor R1 and the infrared receiver R2 both cover a plurality of first sub-pixels P1 and a plurality of transparent regions B.

Particularly, in the display panel provided by the embodiments of the present disclosure, an infrared imaging structure may be arranged in the first display region, and specifically, the infrared sensor and the infrared receiver may be arranged in the first display region, so that the infrared sensor and the infrared receiver are located between the base substrate and the first sub-pixels, the infrared sensor can emit infrared rays through the transparent regions, and the infrared receiver receives reflected infrared rays through the transparent regions, thereby obtaining the characteristics of a human face, identifying information of the human face, and realizing the function of unlocking by the human face.

Based on the same inventive concept, the embodiments of the present disclosure also provide a display device, which includes the display panel provided by any one of the aforementioned embodiments.

Optionally, the display device provided by the embodiments of the present disclosure further includes a groove located in the display panel and a camera located in the groove.

Particularly, in the display device provided by the embodiments of the present disclosure, the groove may be arranged in the display panel for accommodating various components of the camera. Specifically, the groove may be arranged in a peripheral region surrounding the first display region and the second display region, or alternatively may be located in the first display region so that the first display region is disposed around the groove. The specific arrangement position of the camera can be selected according to the actual design, and is not specifically limited here.

The display device may be a terminal display device such as a mobile phone, a tablet computer, a notebook computer, a display and the like, and the display device has all the advantages of the display panel provided by any one of the aforementioned embodiments, and can be specifically implemented with reference to the display panel provided by any one of the aforementioned embodiments, which will not be described in details here anymore.

The embodiments of the present disclosure provide a display panel and a display device. The display panel includes a base substrate, and a first display region and a second display region that are located on the base substrate, where the first display region includes a plurality of first sub-pixels and a plurality of transparent regions, the second display region includes a plurality of second sub-pixels, and the distribution density of the first sub-pixels is smaller than the distribution density of the second sub-pixels; and the area occupied by the first sub-pixels is smaller than the area occupied by the second sub-pixels. By reducing the distribution density of the first sub-pixels in the first display region and reducing the area occupied by the first sub-pixels, the area of the transparent regions in the first display region is increased, and thus imaging structures can be arranged in the transparent regions, so that the first display region can not only be used for displaying to improve the screen-to-body ratio of the display region, but also be used for imaging through the transparent regions, thereby meeting various demands of users.

Obviously, those skilled in the art can make various changes and modifications to the present disclosure without departing from the spirit and scope of the present disclosure. As such, if these modifications and variations of the present disclosure fall within the scope of the claims of the present disclosure and their equivalent technologies, the present disclosure is also intended to include these modifications and variations.

What is claimed is:

1. A display panel, comprising:
    a base substrate, and a first display region and a second display region that are arranged on the base substrate;
    wherein the first display region comprises a plurality of first sub-pixels and a plurality of transparent regions, the second display region comprises a plurality of second sub-pixels, and a distribution density of the first sub-pixels is smaller than that of the second sub-pixels; and
    an area occupied by the first sub-pixels is smaller than that occupied by the second sub-pixels;
    wherein first sub-pixels arranged in a same row are electrically connected with a same first initial signal line extending in a first direction; first sub-pixels arranged in different rows are electrically connected with different first initial signal lines extending in the first direction, respectively; and second sub-pixels in every two adjacent rows are electrically connected with a same second initial signal line extending in the first direction;
    wherein the display panel further comprises: trace regions arranged between every two adjacent first sub-pixels in the first direction;
    wherein, the every two adjacent first sub-pixels in the first direction are electrically connected with a same third initial signal line extending in a second direction in the trace regions; and the first direction and the second direction are perpendicular to each other.

2. The display panel according to claim 1, wherein each of the first sub-pixels at least comprises a semiconductor layer, a gate layer, a source-drain electrode layer and a shielding electrode; and an orthographic projection of the shielding electrode on the base substrate at least covers an orthographic projection of the semiconductor layer on the base substrate.

3. The display panel according to claim 1, the third initial signal line is arranged at a same layer as a source-drain electrode layer, and the third initial signal line is arranged at different layers from the first initial signal line and the second initial signal line.

4. The display panel according to claim 2, wherein the shielding electrode is electrically connected with the source-drain electrode layer.

5. The display panel according to claim 1, further comprising: a first voltage signal line, a second voltage signal line and a third voltage signal line that are arranged on the base substrate;

the first voltage signal line and the second voltage signal line are configured to provide a positive voltage signal, respectively, and the third voltage signal line is configured to provide a negative voltage signal; and the first voltage signal line is electrically connected with the first sub-pixels, the second voltage signal line is electrically connected with the second sub-pixels, and the third voltage signal line is electrically connected with the first sub-pixels and the second sub-pixels, respectively.

6. The display panel according to claim 5, wherein a voltage applied to the first voltage signal line is greater than a voltage applied to the second voltage signal line.

7. The display panel according to claim 1, further comprising: an infrared sensor and an infrared receiver that are arranged in the first display region;

the infrared sensor and the infrared receiver are arranged between the base substrate and the first sub-pixels; and an orthographic projection of the infrared sensor on the base substrate and an orthographic projection of the infrared receiver on the base substrate have an overlapping area with an orthographic projection of the plurality of first sub-pixels on the base substrate, respectively.

8. A display device, comprising the display panel according to claim 1.

9. The display device according to claim 8, further comprising: a groove arranged in the display panel, and a camera arranged in the groove.

* * * * *